United States Patent [19]

Sakurai

[11] Patent Number: 5,204,988
[45] Date of Patent: Apr. 20, 1993

[54] MOS SEMICONDUCTOR DEVICE HAVING A SURGE PROTECTING ELEMENT

[75] Inventor: Kenya Sakurai, Kanagawa, Japan

[73] Assignee: Fuji Electic Co., Ltd., Kanagawa, Japan

[21] Appl. No.: 729,390

[22] Filed: Jul. 12, 1991

[30] Foreign Application Priority Data

Jul. 16, 1990 [JP] Japan ............................ 2-187453

[51] Int. Cl.[5] ................. H01L 29/78; H01L 29/04; H01L 29/90
[52] U.S. Cl. .................................. 257/356; 257/603; 257/49
[58] Field of Search ..................... 357/23.13, 13, 59

[56] References Cited

U.S. PATENT DOCUMENTS

| 4,831,424 | 5/1989 | Yoshida et al. ............. | 357/23.13 |
| 5,012,317 | 4/1991 | Rountre ................... | 357/13 |
| 5,025,298 | 6/1991 | Fay et al. ................. | 357/41 |
| 5,027,251 | 6/1991 | Hirota et al. .............. | 357/23.13 |
| 5,077,591 | 12/1991 | Chen et al. ................ | 357/23.13 |

FOREIGN PATENT DOCUMENTS 58-87873   5/1983  Japan .
58-178566 10/1983  Japan .
61-296770 12/1986  Japan .

Primary Examiner—Gene M. Munson
Attorney, Agent, or Firm—Finnegan, Henderson, Farabow, Garrett & Dunner

[57] ABSTRACT

A MOS semiconductor device having a surge protecting circuit comprising a semiconductor substrate having a major surface, a plurality of electrodes overlying the major surface, a MOS circuit in the major surface, and a bidirectional semiconductor surge absorber coupled between the gate of the MOS circuit and a reference electrode contacting the major surface of the substrate. In another embodiment, the MOS semiconductor device further comprises a bidirectional Zener diode connected in series with the bidirectional semiconductor surge absorber.

35 Claims, 6 Drawing Sheets

MOS SEMICONDUCTOR DEVICE HAVING A SURGE PROTECTING ELEMENT

BACKGROUND OF THE INVENTION

A. Field of the Invention

The present invention relates to a MOS semiconnector device, more particularly a MOS semiconductor device having a MOS structure on one of its major surfaces, to control current flowing between electrodes on both of the major surfaces.

B. Description of the Prior Art

In recent years, there has been a strong market thrust for power switching elements with improved performances such as higher operating speed, breakdown voltage, and power handling capability. In light of this, because of good switching characteristics, MOS devices have been considered for such power switching elements; and considerable progress has been made in the MOS semiconductor technology.

In a vertical MOSFET, which has been a main technology for such power switching elements, the current, flowing in contact with both major surfaces of its semiconductor substrate, is controlled by a plurality of MOS structures on one of the major surfaces. The vertical MOSFET of this type is referred to as an insulated gate power MOSFET. In a conductivity modulation MOSFET, referred to as an insulated gate bipolar transistor, several layers, each of a different conductivity type, are formed on a major surface of the substrate opposite the surface having a MOS structure thereon, and the ON resistance of the MOSFET is reduced by conductivity modulation. Use of such a conductivity modulation MOSFET for power switching elements has gradually been increasing, particularly for switching power elements of the type requiring a higher breakdown voltage and larger current.

However, the above MOSFET devices have a problem in that a gate insulating film, which is formed between the gate electrode on the major surface, the MOS structure, and the source region contacting one end of the channel formed under the gate electrode, is easily destroyed by a surge voltage. The gate insulating film usually has a thickness of 500 to 1000 Å and is easily destroyed by a surge voltage of 40 to 80 V. For this reason, much care had to be taken so as not to generate static electricity when handling such devices.

Some methods for protecting the gate insulating film against such surge voltages have been proposed in Japanese Patent Unexamined Publications Nos.: Sho. 58-87873, Sho. 58-178566, and Sho. 61-296770, for example. In these proposed methods, a bidirectional Zener diode is constructed in the polycrystalline silicon layer formed in the surface of the semiconductor substrate, and connected between the gate and source of the MOS device.

FIGS. 1 and 2 illustrate the structure of such a vertical MOSFET, as described in Japanese Patent Unexamined Publication No. Sho. 58-87873. Referring to FIG. 1, a p+ well 2 is formed in the surface region of an n-type silicon layer 1. An n+ source region 3 is formed in the surface region of p+ well 2. A gate 5 made of a polycrystalline silicon layer is formed over a gate oxide film 4, to form a channel between n-type layer 1, p+ well 2, and n+ region 3. A bidirectional Zener diode, which extends from gate 5, consists of a p region 71, and n+ regions 72 and 73 on each side of p-region 71, is formed on an insulating film 6 extending to gate oxide film 4.

The n+ region 72 and n+ source region 3 are connected to a source terminal S. The n+ region 73 and gate 5 are connected to a gate terminal G. An n+ layer 8, on the side of n-type layer 1 opposite the bidirectional Zener diode, is connected to a drain terminal D. A p layer 21 having an edge breakdown voltage structure is formed under the bidirectional Zener diode.

FIG. 2 is a perspective view of the bidirectional Zener diode portion of the vertical MOSFET of FIG. 1. FIG. 3 is a circuit schematic of the vertical MOSFET of FIGS. 1 and 2 which comprises a vertical MOSFET 31 and a bidirectional Zener diode 32 connected between the gate and source of MOSFET 31.

With a trend toward increasing operating frequencies and power handling capacity, surge voltages are also increasing. For example, in large power switching elements for automotive applications, the MOS device has to operate under most severe conditions; for example, the device must withstand surge voltages as shown in FIG. 4. Under these circumstances, the conventional surge protecting method of using the bidirectional Zener diode as surge protecting element (such as described above) would not provide sufficient protection from such large surge voltages. As a solution, increasing the effective area of the protecting Zener diode has been proposed. However, this approach increases manufacturing cost, because the area of the protecting Zener diode necessary to absorb such large surge voltages is considerably larger than a commercially desirable size.

SUMMARY OF THE INVENTION

The object of the present invention is to eliminate the above problems by providing an input protecting function in the MOS semiconductor device, in which the surge voltage withstand capability per unit area of the device is considerably improved relative to that of the conventional device.

To achieve the above object and in accordance with the purpose of the invention, as embodied and broadly described herein, the MOS semiconductor device, according to an embodiment of the present invention, comprises a plurality of electrodes overlying a major surface of the semiconductor substrate; a MOS circuit in the major surface; a bidirectional semiconductor surge absorber coupled between the gate of the MOS circuit and one of the electrodes which contacts the major surface of the substrate. According to another embodiment of the invention, the MOS semiconductor device further comprises a bidirectional Zener diode connected in series with the bidirectional semiconductor surge absorber.

The accompanying drawings, which are incorporated in and constitute a part of this specification, illustrate several embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
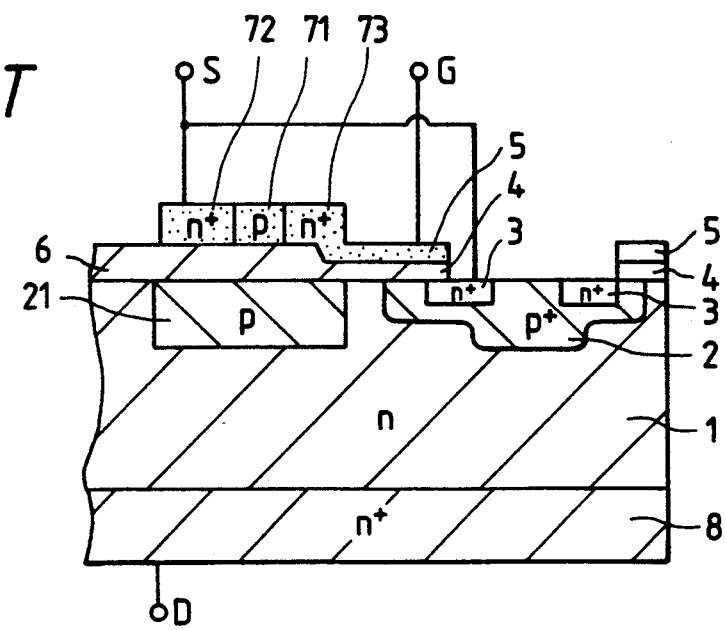
FIG. 1 is a cross sectional view of the structure of a vertical MOSFET having a conventional surge protection system.
Figure 2:
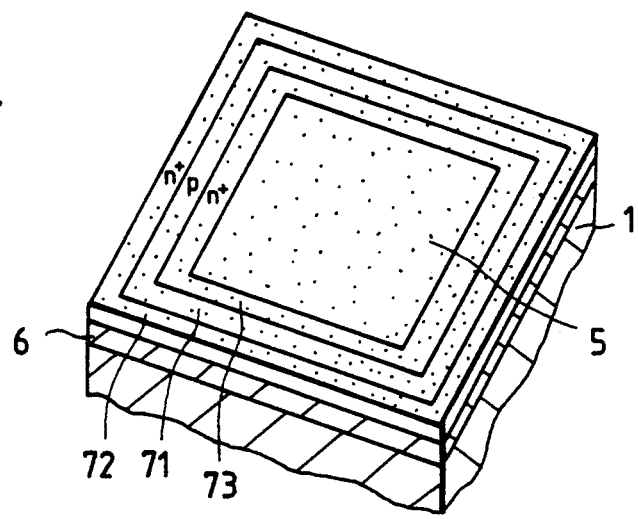
FIG. 2 is a perspective view of the structure of FIG. 1 from the circuit side of the device.
Figure 3:
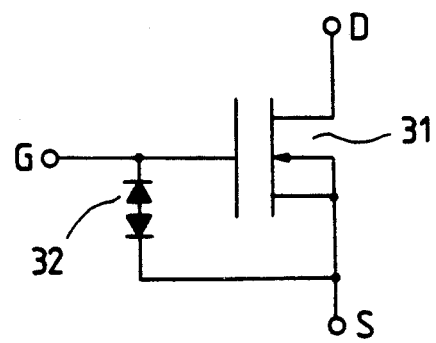
FIG. 3 is a circuit schematic of the structure of FIGS. 1 and 2.
Figure 4:
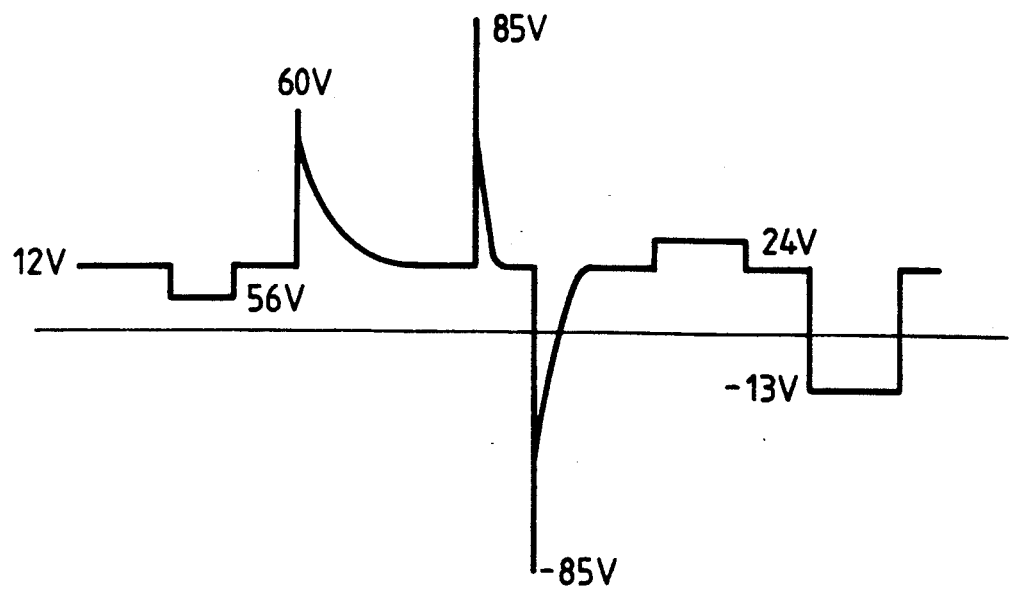
FIG. 4 is a waveform for surge voltages applied to a semiconductor device in an automotive environment.
Figure 5:
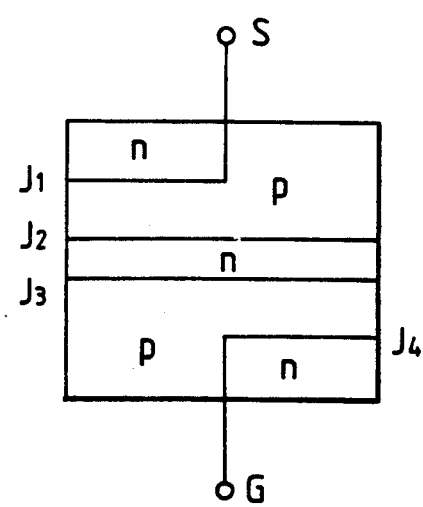
FIG. 5 is a conceptual diagram of a bidirectional surge absorber according to an embodiment of the present invention.

The bidirectional surge absorber, as embodied herein, has an n-p-n-p-n structure (as shown in FIG. 5) or a p-n-p-n-p structure of the inverted conductivity types. The surge absorber embodied herein, unlike the Zener diode, turns on a parasitic thyristor at a particular level of current in the reversedirection avalanche region, to thereby absorb the surge energy at a low clamp voltage. Accordingly, the surge energy absorbing capability per unit area of the device of the bidirectional surge absorber embodied herein is considerably greater than that of the above-described Zener diode.

According to the embodiments of the present invention, when a surge voltage is applied to a MOS semiconductor device to be protected, the bidirectional surge protecting absorber is turned on and its clamp voltage drops to a low level. Further, the voltage between the gate and the electrode which serves as a reference potential drops below the threshold voltage of the device, so as to turn off and thus protect the device.

On the other hand, when a normal input signal voltage is applied to the device, the bidirectional surge absorber is automatically restored to a normal state. When the surge protecting element and the MOS semiconductor device are fabricated into the same substrate, parasitic effects would possibly occur.

Figure 6:
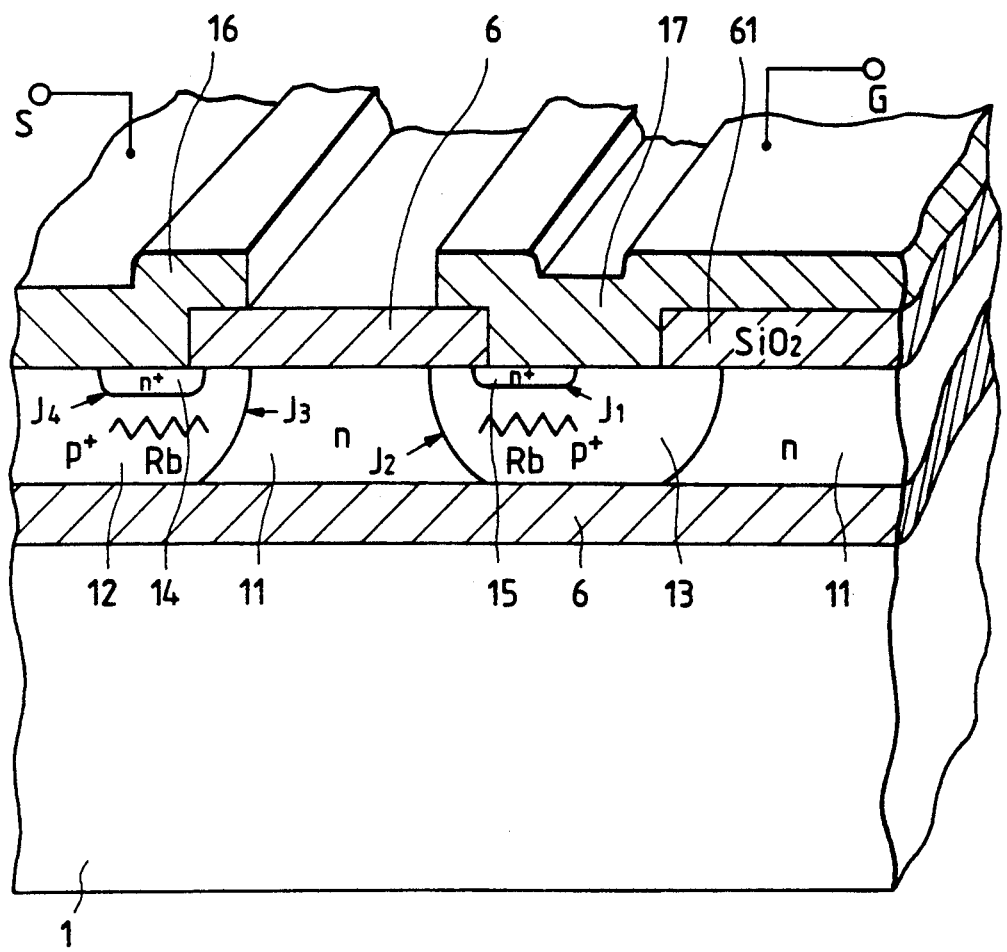
FIG. 6 is a cut away view of the bidirectional surge absorber according to the embodiment of the present invention.

FIG. 6 shows a way to eliminate some parasitic effects. An n-type layer 11 is grown on an SiO$_2$ film 6, and completely insulated from a silicon layer 1. The p$^+$ base regions 12 and 13 are formed in n- layer 11. The n$^+$ diffusion regions 14 and 15 are selectively formed in the surface regions of p$^+$ base regions 12 and 13, respectively. Then, p$^+$ region 12 and n$^+$ region 14 are connected to an electrode 16, and p$^+$ region 13 and n$^+$ region 15 are connected to an electrode 17, through the openings of an SiO$_2$ film 61, to form thereby the bidirectional surge absorber structure of FIG. 5. Junctions $J_1$ to $J_4$ of FIG. 5 are shown in respective positions in FIG. 6, designated by the same reference numerals. Electrode 16 is connected to a source terminal S, and gate electrode 17 is connected to a gate terminal G, to provide the bidirectional surge absorber between the gate and source of the device. The operation of the surge protecting element thus constructed will be described.

When a negative surge voltage is applied to gate terminal G, p$^+$n junction $J_2$ becomes reverse biased, and its depletion layer expands mainly toward n-type layer 11. At this time, junction $J_3$ is forward biased, but the current flowing therethrough is very small because it is impeded by junction $J_2$.

When the negative surge voltage increases and junction $J_3$ enters the avalanche breakdown region in its operating state, the avalanche-multiplied hole current passes through p$^+$ base region 13 adjacent n$^+$ diffusion region 15 or n$^+$p$^+$ junction $J_1$, and flows into gate terminal G. At this time, if the potential in p$^+$ base region 13 adjacent n$^+$ region 15 exceeds a diffusion potential 0.7 V at n$^+$p$^+$ junction $J_1$, junction $J_1$ is forward biased, so that a large number of electrons are injected from n$^+$ diffusion region 15 into the depletion layer.

In other words, the parasitic transistor is turned on. In order that the surge protecting element undergoes this unique breakover and enters the negative resistance region, the following relation must be satisfied $$\alpha_1 + \alpha_2 = 1$$

where $\alpha_1$ represents the current amplification factor of the n$^+$p$^+$n transistor of the $J_1$ and $J_2$ junctions, and $\alpha_2$ indicates the current amplification factor of the n$^+$p$^+$n transistor of the $J_4$ and $J_3$ junctions. Therefore, the bidirectional surge absorber embodied herein abruptly enters the turn-on region in its operating state in excess of the breakover voltage, and absorbs the surge voltage energy at a low impedance, producing much greater surge energy absorbing capability than the Zener diode.

When a large surge voltage enters the absorber, the absorber enters the turn-on region in excess of the breakover voltage. When the surge protecting absorber is engaged in a small turn-on region, the gate-source voltage of the absorber drops below the threshold voltage or the gate-source current decreases approximately to a current value corresponding to an off-state of the absorber. Then, when the input voltage applied to the absorber settles down to a normal gate-source voltage, the main semiconductor device automatically restores itself to a normal state of operation.

In some applications, it is desired that the MOS semiconductor device is not completely turned off even if the surge voltage entering the surge absorber is in excess of the breakover voltage. In this case, it is necessary to set the gate voltage at a predetermined voltage, $\pm 10$ V or $\pm 15$ V, so that when the surge voltage exceeds the breakover voltage of the surge absorber, the surge absorber will enter the turn-on region.

During the transient period of the surge protecting absorber, the gate voltage is cut by the bidirectional Zener diode of 10 V or 15 V, and then the surge energy is absorbed by the low voltage Zener diode. In this case, the gate voltage can be retained at approximately 10 V or 15 V, even if the surge absorber is turned on. Examples of those characteristics are illustrated in FIGS. 7 and 8.

Figure 7:
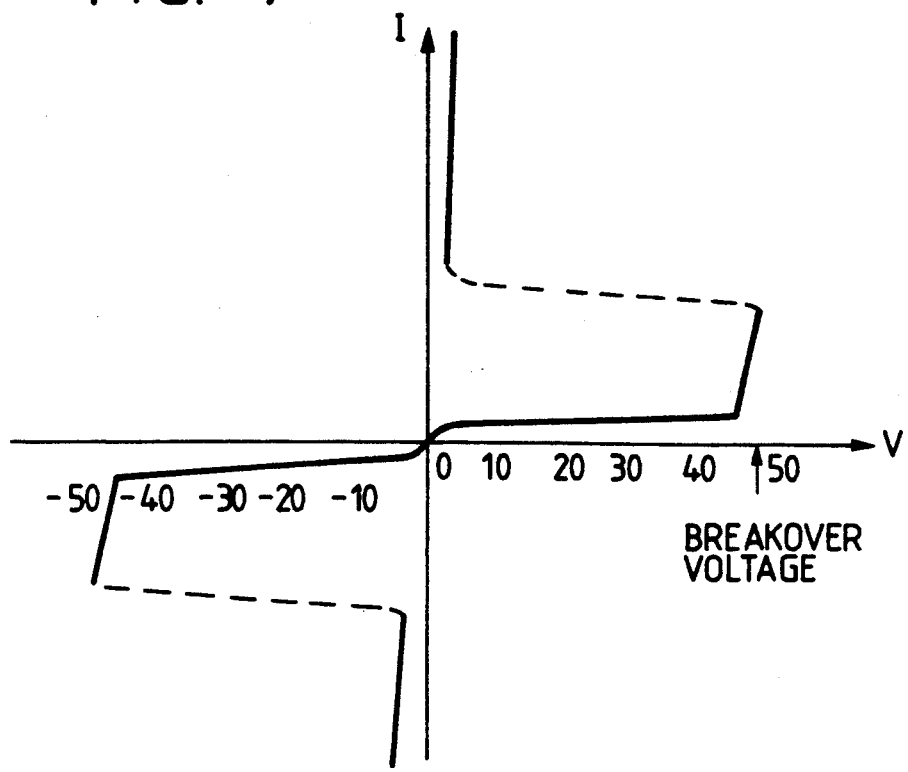
FIG. 7 shows a current vs. voltage characteristic of the bidirectional surge absorber according to one embodiment of the invention.

FIG. 7 shows the current vs. voltage characteristic of the device when only the bidirectional surge absorber is used. In this case, when the surge absorber breaks over, the gate voltage is decreased to an extremely low level so as to turn off the MOS semiconductor device, as above described.

Figure 8:
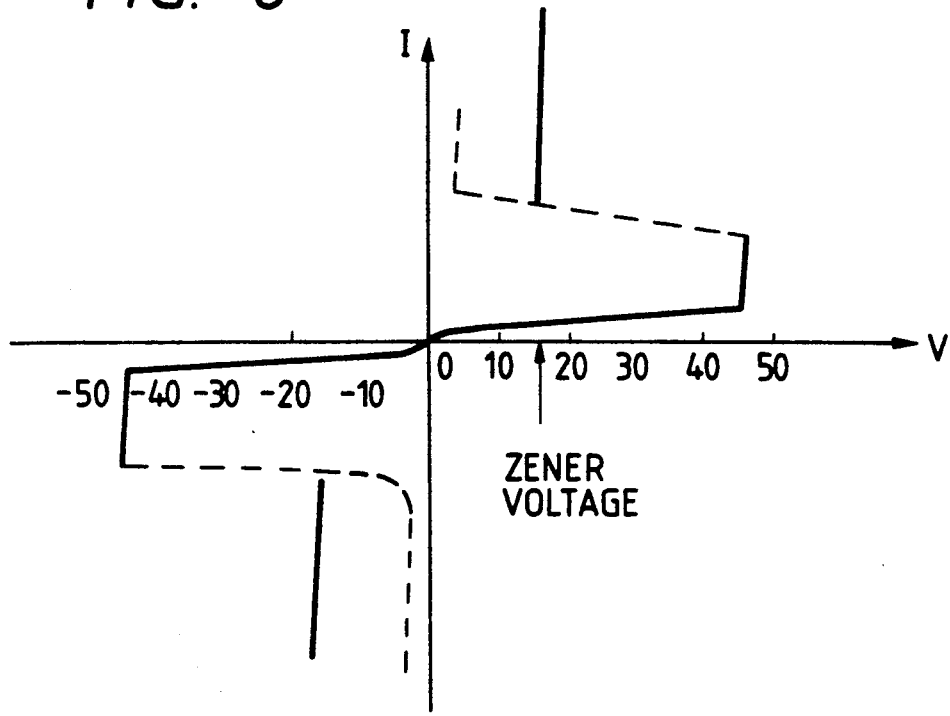
FIG. 8 shows a current vs. voltage characteristic of the bidirectional surge absorber according to another embodiment of the invention.
Figure 12:
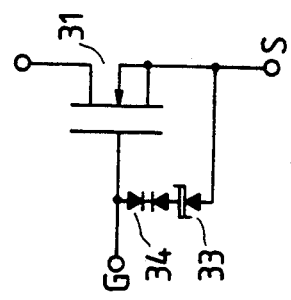
FIG. 12 is a circuit schematic of the structure of FIG. 11.

FIG. 8 shows the I-V characteristic when the bidirectional surge absorber is connected in series with a bidirectional Zener diode, as per FIG. 12. In this case, when the surge absorber breaks over, the gate voltage is clamped by the low breakdown Zener diode, and is limited to an approximately 10 V or 15 V. Therefore, the MOS device would not turn-off automatically ("self" turn-off). As a consequence, the load current would not be influenced by an incoming surge voltage, and the gate insulating film of the semiconductor device can be reliably protected.

Figure 9:
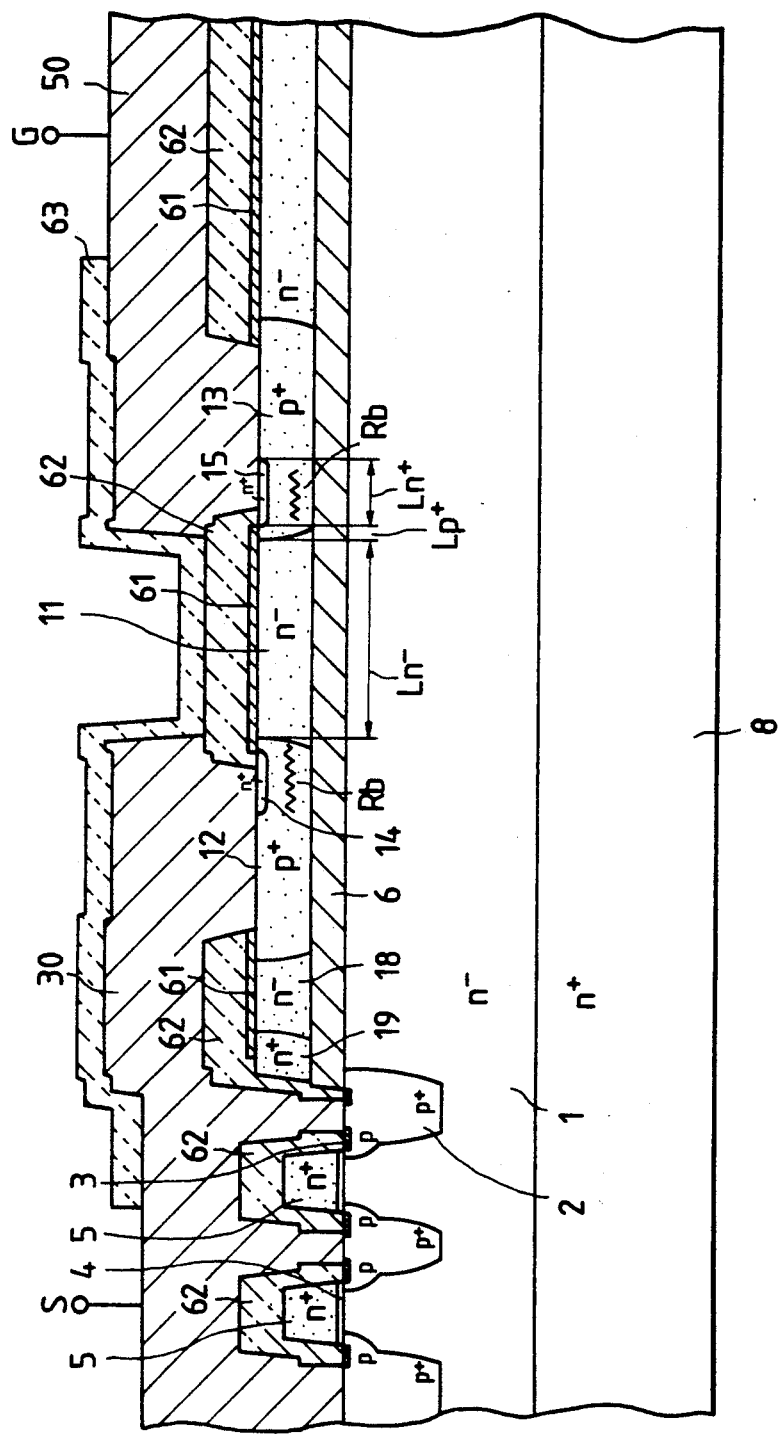
FIG. 9 is a cross sectional view of the structure of a power vertical MOSFET having a surge protecting element according to an embodiment of the present invention.

Referring to FIG. 9, in an integrated implementation of the first embodiment, a gate 5 made of $n^+$ polycrystalline silicon layer is formed over the surface of an $n^-$ layer 1 laterally between a pair of $n^+$ regions 3. Each pair of $n^+$ regions 3 are formed in the surface of a respect one of a plurality of $p^+$ layers 2. A gate oxide film 4 is vertically interposed between gate 5 and $n^-$ layer 1. The $p^+$ regions 12 and 13, made of polycrystalline silicon layer, are formed on an $SiO_2$ layer 6 located on the periphery of the gate pad (not shown) coupled to gate 5. An $n^-$ region 11 is laterally interposed between $p^+$ regions 12 and 13.

The $n^+$ regions 14 and 15 are formed in the surface regions of $p^+$ regions 12 and 13, respectively. The $n^+$ region 14 and $p^+$ region 12 contact a source electrode 30. Source electrode 30 connects $n^+$ region 14 and $p^+$ region 12 to $p^+$ wells 2 and source regions 3 through the openings of an $SiO_2$ film 61 and a PSG (phosphor silicate glass) layer 62 for protecting the junctions thereunder.

The $p^+$ region 13 and $n^+$ region 15 contact a gate electrode 50. Gate electrode 50 connects $p^+$ region 13 and $n^+$ region 15 to the gate pad through the openings of $SiO_2$ film 61 and PSG layer 62. Source electrode 30 is connected to a source terminal S, and gate electrode 50 is connected to a gate terminal G. At least some portions of the surface of source electrode 30 and gate electrode 50 are covered by an SiN film 63.

Figure 10:
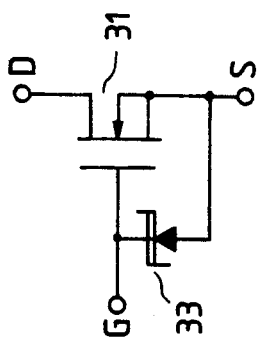
FIG. 10 is a circuit schematic of the structure of FIG. 9.

The $n^+$ region 14, $p^+$ region 12, $n^-$ region 11, $p^+$ region 13, and $n^+$ region 15 cooperate to constitute a bidirectional surge absorber of an n-p-n-p-n structure. A circuit schematic of the semiconductor device thus constructed is shown in FIG. 10, in which the bidirectional surge absorber is designated by a reference numeral 33.

Referring back to FIG. 9, to fabricate the bidirectional surge absorber, an $n^-$ polycrystalline silicon layer is grown on oxide films 4 and 6. Impurities are selectively doped into the n-polycrystalline silicon layer, to form $n^+$ gate 5, and $p^+$ regions 12 and 13. Then, $n^+$ regions 14 and 15 are formed in the surface regions of $p^+$ regions 12 and 13, respectively. An $n^+$ region 19, which has the edge voltage resistance structure of the $n^-$ polycrystalline silicon layer, forms the edge portion in cooperation with $n^+$ gate 5, both sandwiching $n^-$ region 18.

The breakover voltage, breakover current and turn-on voltage of the silicon surge absorber depend greatly on lengths $Rb$, $Ln^-$, and $Lp^+$, and the resistivity of the $n^-$ polycrystalline silicon layer. Accordingly, these lengths and the resistivity are optimized according to a specific application and the size of surge voltage. The bidirectional surge absorber could alternatively be constructed by irradiating the $n^-$ polycrystalline silicon layer with a laser beam so as to form a monocrystalline silicon layer, and forming subsequent layers in the monocrystalline silicon layer.

Figure 11:
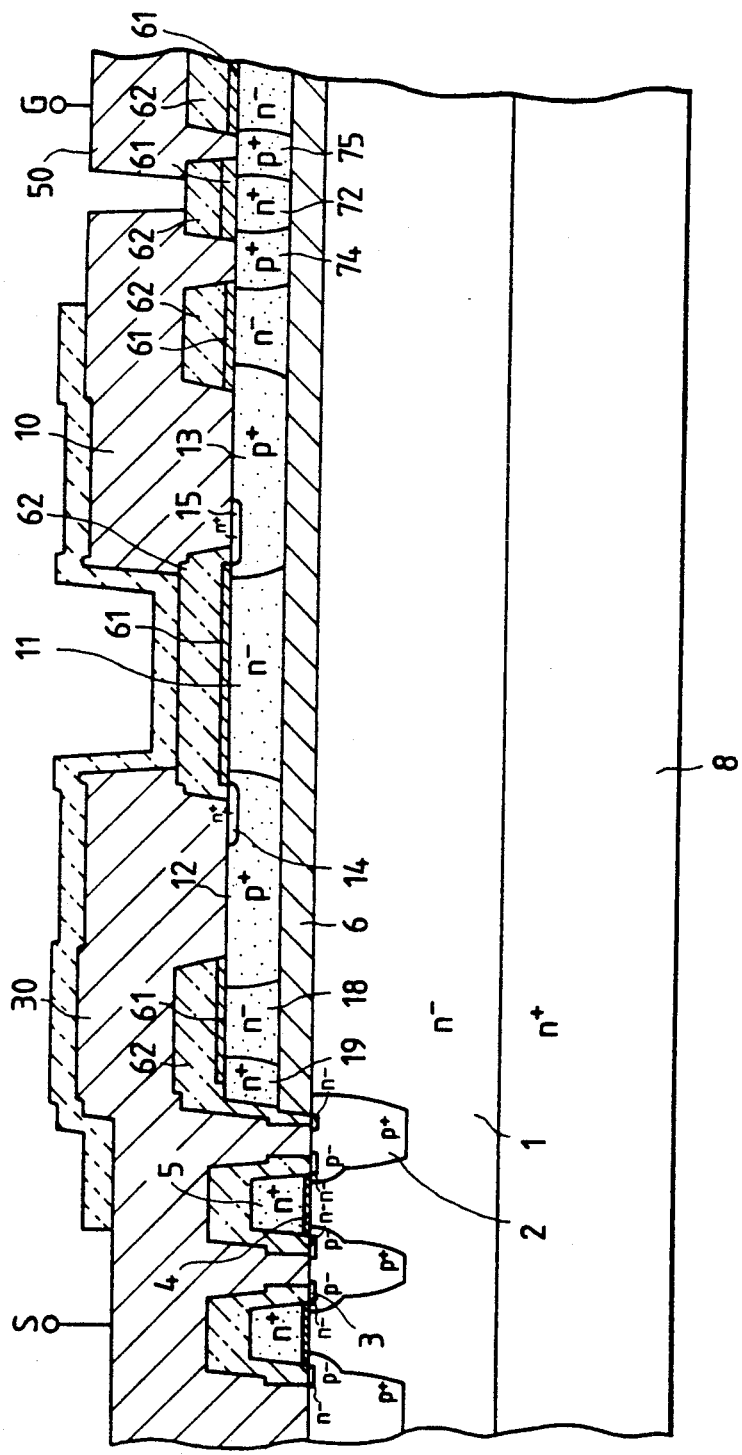
FIG. 11 is a cross sectional view of the structure of a power vertical MOSFET having a surge protective element according to another embodiment of the present invention.

FIG. 11 is a cross sectional view showing the structure of a power vertical MOSFET and integrated protection elements according to another embodiment of the present invention producing the results of FIG. 8. The same reference numerals and characters are used here for designating the same or equivalent portions in FIG. 10. In FIG. 12, a low breakdown voltage bidirectional Zener diode is formed, which comprises an $n^+$ region 72, $p^+$ region 74, and $p^+$ region 75 formed in the polycrystalline silicon layer on insulating film 6. The $p^+$ region 74 is connected to the bidirectional surge absorber through a wire 10. The $p^+$ region 75 is connected to gate electrode 50.

A circuit schematic of the structure embodied in FIG. 11 is shown in FIG. 12, in which a bidirectional surge absorber 34 and a Zener diode 33 are connected in series between the gate and source of a MOSFET 31. In this configuration, bidirectional surge absorber 34 breaks over, the voltage at the gate of MOSFET 31 is kept at approximately 10 V or 15 V, to prevent MOSFET 31 from turning off by itself.

While in the above embodiments, the main semiconductor device is the n-channel vertical MOSFET, the present invention is also applicable for IGBTs in which a $p^+$ layer would be used in place of $n^+$ layer 8 as in FIGS. 9 and 11. Further, it is also applicable for p-channel MOS semiconductor devices in which the conductivity types of the respective portions of the device are inverted with respect to the n-channel MOS device shown in FIGS. 9 and 11, and also applicable for lateral MOSFETs in which both the main electrodes of the device are provided on one of the major surfaces of the semiconductor substrate.

As described above, in the above embodiments, the bidirectional surge absorber, either by itself or in a series connection with the low breakdown voltage Zener diode, is connected between the gate of the MOS circuit in the device and one of the major electrodes which are at a reference potential, and connects to the surface of the MOS semiconductor device on which the gate of the device is formed. With this circuit layout, the surge protecting element of the above embodiments provides a greater capability of absorbing the surge voltage per unit area of the device than the bidirectional Zener diode; thus, it is capable of absorbing a substantially greater surge voltage. The MOS semiconductor device of the invention has a high performance/cost ratio and high energy absorption capability, as well as the functions of self-turn-off and self-restoration. Further, the gate voltage of the device is always kept at a normal gate voltage.

Other embodiments of the invention will be apparent to those skilled in the ar from consideration of the specification and practice of the invention disclosed herein. It is intended that the specification and examples be considered as exemplary only, with a true scope and spirit of the invention being indicated by the following claims.

What is claimed is:

1. A MOS semiconductor device having a surge protecting circuit, comprising:
   a semiconductor substrate having a major surface;
   a plurality of electrodes overlying said major surface;
   a MOS circuit in said major surface;
   a bidirectional semiconductor surge absorber, coupled between the gate of said MOS circuit and a reference one of said electrodes contacting said major surface of the substrate; and
   a bidirectional Zener diode connected in series with said bidirectional semiconductor surge absorber.

2. The MOS semiconductor device of claim 1, wherein said semiconductor substrate further includes a bottom surface opposite and spaced from said major surface, further comprising at least one electrode on said bottom surface.

3. The MOS semiconductor device of claim 1, wherein said bidirectional Zener diode includes at least two regions of different conductivity types.

4. The MOS semiconductor device of claim 1, wherein said semiconductor substrate includes:
   a first semiconductor layer of a first conductivity type adjacent said major surface;
   one or more first regions of a second conductivity type selectively in the surface of said semiconductor layer, said second conductivity type being different from the first conductivity type; and
   one or more second regions of the first conductivity type being selectively in the surface of said first region.

5. The MOS semiconductor device of claim 4, wherein said reference electrode contacts said first and second regions.

6. The MOS semiconductor device of claim 4, wherein the impurity concentration of said second regions is greater than that of said first semiconductor layer.

7. The MOS semiconductor device of claim 4, further comprising a gate insulating film at least partially on said first region and an exposed portion of said semiconductor layer.

8. The MOS semiconductor device of claim 7, further comprising a gate on said gate insulating film.

9. The MOS semiconductor device of claim 4, further comprising an insulating layer at least partially on said first region and an exposed portion of said first semiconductor layer.

10. The MOS semiconductor device of claim 9, wherein said bidirectional semiconductor surge absorber is on said insulating layer.

11. The MOS semiconductor device of claim 9, wherein said bidirectional Zener diode is on said insulating layer.

12. A MOS semiconductor device having a surge protecting circuit, comprising:
   a semiconductor substrate having a major surface, wherein said semiconductor substrate includes,
      a first semiconductor layer of a first conductivity type adjacent said major surface;
      one or more first regions of a second conductivity type selectively in the surface of said first semiconductor layer, said second conductivity type being different from the first conductivity type; and
      one or more second regions of the first conductivity type being selectively in the surface of said first region;
   a plurality of electrodes overlying said major surface;
   a MOS circuit in said major surface; and
   a bidirectional semiconductor surge absorber, coupled between the gate of said MOS circuit and a reference one of said electrodes contacting said major surface of the substrate, wherein said reference electrode contacts said first and second regions.

13. A MOS semiconductor device having a surge protecting circuit, comprising:
   a semiconductor substrate having a major surface;
   a plurality of electrodes overlying said major surface;
   a MOS circuit in said major surface;
   a bidirectional semiconductor surge absorber, coupled between the gate of said MOS circuit and a reference one of said electrodes contacting said major surface of the substrate, wherein said bidirectional semiconductor surge absorber includes,
      a first semiconductor layer of a first conductivity type overlying said major surface;
      one or more base regions of a second conductivity type selectively throughout the said first semiconductor layer, said second conductivity type being different from the first conductivity type; and
      one or more diffusion regions of the first conductivity type selectively formed in the surface of said base region.

14. The MOS semiconductor device of claim 13, wherein the impurity concentration of said diffusion region is greater than that of said first semiconductor layer.

15. The MOS semiconductor device of claim 13, wherein said reference electrode contacts one base region and one diffusion region adjacent to said one base region.

16. The MOS semiconductor device of claim 13, wherein said semiconductor substrate further includes a bottom surface opposite and spaced from said major surface, further comprising at least one electrode on said bottom surface.

17. The MOS semiconductor device of claim 13, wherein said semiconductor substrate includes:
   a second semiconductor layer of a first conductivity type adjacent said major surface;
   one or more first regions of a second conductivity type selectively in the surface of said second semiconductor layer, said second conductivity type being different from the first conductivity type; and
   one or more second regions of the first conductivity type being selectively in the surface of said first region.

18. The MOS semiconductor device of claim 17, wherein said reference electrode contacts said first and second regions of said second semiconductor layer.

19. The MOS semiconductor device of claim 17, wherein the impurity concentration of said second regions is greater than that of said second semiconductor layer.

20. The MOS semiconductor device of claim 17, further comprising an insulating film at least partially on said first region and an exposed portion of said second semiconductor layer.

21. The MOS semiconductor device of claim 20, further comprising a gate on said insulating film.

22. The MOS semiconductor device of claim 21, further comprising a gate electrode, wherein said gate electrode contacts a second base region and one diffusion region adjacent to said second base region, said gate electrode being connected to said gate.

23. The MOS semiconductor device of claim 17, further comprising an insulating layer at least partially on said first region and an exposed portion of said second semiconductor layer.

24. The MOS semiconductor device of claim 23, wherein said bidirectional semiconductor surge absorber is one said insulating layer.

25. A MOS semiconductor device of claim 13, further comprising a bidirectional Zener diode connected in series with said bidirectional semiconductor surge absorber.

26. The MOS semiconductor device of claim 25, wherein said semiconductor substrate further includes a bottom surface opposite and spaced from said major surface, further comprising at least one electrode on said bottom surface.

27. The MOS semiconductor device of claim 25, wherein said bidirectional Zener diode includes at least two regions of different conductivity types.

28. The MOS semiconductor device of claim 25, wherein said semiconductor substrate includes:
a second semiconductor layer of a first conductivity type adjacent said major surface;
one or more first regions of a second conductivity type selectively in the surface of said second semiconductor layer, said second conductivity type being different from the first conductivity type; and
one or more second regions of the first conductivity type being selectively in the surface of said first region.

29. The MOS semiconductor device of claim 28, wherein said reference electrode contacts said first and second regions.

30. The MOS semiconductor device of claim 28, wherein the impurity concentration of said second regions is greater than that of said second semiconductor layer.

31. The MOS semiconductor device of claim 28, further comprising an insulating film at least partially on said first region and an exposed portion of said second semiconductor layer.

32. The MOS semiconductor device of claim 31, further comprising a gate on said insulating film.

33. The MOS semiconductor device of claim 28, further comprising an insulating layer at least partially on said first region and an exposed portion of said second semiconductor layer.

34. The MOS semiconductor device of claim 33, wherein said bidirectional semiconductor surge absorber is on said insulating layer.

35. The MOS semiconductor device of claim 33, wherein said bidirectional Zener diode is on said insulating layer.

* * * * *

UNITED STATES PATENT AND TRADEMARK OFFICE
CERTIFICATE OF CORRECTION

PATENT NO. : 5,204,988
DATED : April 20, 1993
INVENTOR(S) : Kenya Sakurai

It is certified that error appears in the above-indentified patent and that said Letters Patent is hereby corrected as shown below:

Title Page:
    Item [73] Abstract, line 1, change "Electic" to --Electric--.

Claim 24, column 9, line 9, change "one" to --on--.

Signed and Sealed this

Fifteenth Day of March, 1994

Attest:

BRUCE LEHMAN

Attesting Officer

Commissioner of Patents and Trademarks